Figure 3:
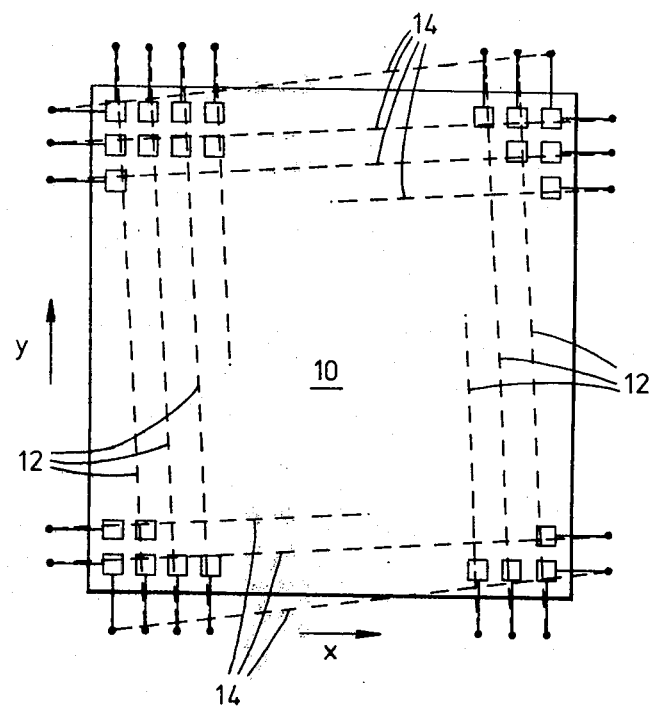

United States Patent [19]

Aubusson et al.

[11] 4,295,182
[45] Oct. 13, 1981

[54] INTERCONNECTION ARRANGEMENTS FOR TESTING MICROELECTRONIC CIRCUIT CHIPS ON A WAFER

[75] Inventors: Russell C. Aubusson, Broxbourne; Richard J. Gledhill, London, both of England

[73] Assignee: The Secretary of State for Industry in Her Britannic Majesty's Government of the United Kingdom of Great Britain and Northern Ireland, London, England

[21] Appl. No.: 120,035

[22] Filed: Feb. 11, 1980

Related U.S. Application Data

[63] Continuation of Ser. No. 948,195, Oct. 2, 1978, abandoned.

[30] Foreign Application Priority Data

Oct. 3, 1977 [GB] United Kingdom ............. 40896/77

[51] Int. Cl.³ ........................................... H01L 27/00
[52] U.S. Cl. .................................. 361/400; 361/409; 324/73 R; 29/574
[58] Field of Search ............. 29/574; 357/75; 324/51, 324/73 R; 361/331, 380, 352, 416, 410, 400, 404, 406, 409, 412, 414; 363/68, 147

[56] References Cited

U.S. PATENT DOCUMENTS

| 3,302,067 | 1/1967 | Jackson | 361/404 |
| 3,395,318 | 7/1968 | Laemer | 361/404 |
| 3,605,063 | 3/1969 | Stewart | 361/409 |
| 3,913,072 | 10/1975 | Catt | 364/900 |
| 4,044,453 | 8/1977 | Vorback | 29/574 |

FOREIGN PATENT DOCUMENTS 1377859 12/1974 United Kingdom .

OTHER PUBLICATIONS

"Programmable Cellular Logic Arrays," R. G. Shoup, Thesis at Carnegie-Melon University, 1970 Computer Science, microfilmed by University Microfilms, Ann Arbor, Michigan, 1970.

Primary Examiner—Gerald P. Tolin
Attorney, Agent, or Firm—Pollock, Vande Sande and Priddy

[57] ABSTRACT

A wafer having microelectronic circuit chips thereon having electrical connections between the chips arranged so that effectively the chips are on a surface which at least in one direction is unbounded. The electrical connections may be arranged so that the chips are effectively on the surface of a cylinder, or they may be effectively on a helix. The electrical connections may optionally be arranged so that the chips are effectively on a toroid, or on an endless helix. The output connections from a chip adjacent one edge of the wafer may be connected through electrical conductors direct to the input connections of a chip adjacent the opposite edge of the wafer.

6 Claims, 3 Drawing Figures

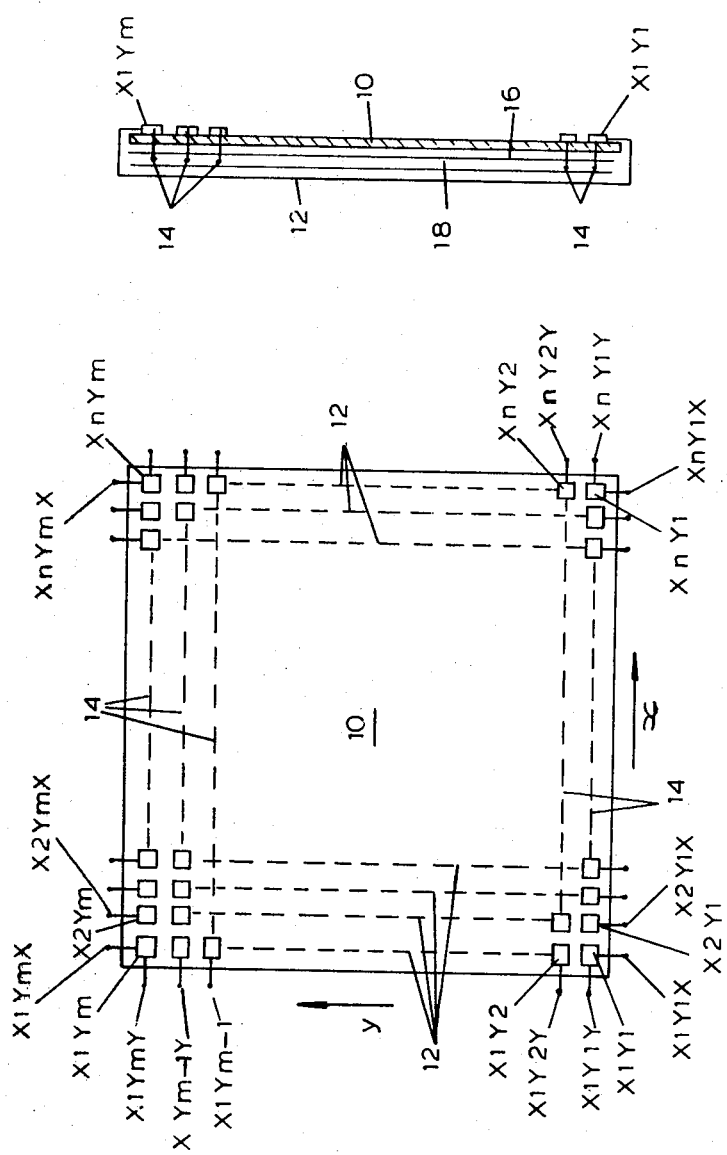

INTERCONNECTION ARRANGEMENTS FOR TESTING MICROELECTRONIC CIRCUIT CHIPS ON A WAFER

This is a continuation, of application Ser. No. 948,195, filed Oct. 2, 1978, now abandoned.

This invention relates to wafers having microelectronic circuit chips thereon.

It is usual to prepare microelectronic circuits on chips in an array on a wafer of basically semiconducting material, such as silicon. For some electronic applications each chip is an entity and the wafer is cut up into separate chips. For other applications it is convenient, or possibly essential, that the chips be interconnectable and the wafer remain as a whole (see in this respect U.K. patent specification No. 1377859, and particularly page 3 column 2 to page 5 column 1 thereof which describe, with reference to FIGS. 6 and 7 of said U.K. patent, such interconnection of chips). It is the latter situation with which the present invention is particularly concerned.

It is very important to be able to circuit test each chip to ensure that it can perform its designed function. This has been an expensive and time-consuming operation, and efforts have been made to render the operation easier and quicker. Quite a large proportion of the total number of chips manufactured may be found on test to be faulty. When the chips are to be used individually a faulty chip may easily be discarded; but when, as mentioned above, the chips are retained relatively fixed as an array on a whole wafer, none can be discarded physically, and means must be found for utilizing the sound chips without obstruction by the faulty ones.

UK Patent Specification No. 1377859 (corresponding to U.S. Pat. No. 3,913,072 describes means for testing chips in a whole wafer. The disclosure of U.S. Pat. No. 3,913,072 is incorporated herein by reference. Briefly, each chip comprises a digital circuit adapted to process digital information, and transfer digital information and control signals from a set of input connections to one of a number of sets of output connections selected by a switching circuit within the digital circuit. Each set of output connections in connectable to input connections of a neighbouring chip according to the operation of the switching circuit.

The result of applying control signals to the input connections of a given first chip of such a wafer is to set up a path of interconnected sound chips extending from said first chip. The path is not precisely predictable, because its configuration is governed by the positions of any faulty chips, which in general are distributed at random throughout the bounded plane of the array of chips on the wafer.

It has been found that in general such a path comes to an end before all the chips on a wafer have been tested. Hence a number of sound chips on the wafer will usually remain unutilized. The present invention provides means for reducing, in any given wafer, the number of chips which remain untested after a path has been extended as far as possible. That is to say, the path length in terms of number of sound chips interconnected is increased.

According to the invention a wafer having microelectronic circuit chips thereon has electrical connections between the chips arranged so that effectively the chips are on a surface which at least in one direction is unbounded.

The electrical connections may be arranged so that the chips are effectively on the surface of a cylinder; or they may be effectively on a helix; or they may be on the surface of a toroid; or they may be on an endless helix.

The output connections from a chip adjacent one edge of the wafer may be conncted through electrical conductors direct to the input connections of a chip adjacent the opposite edge of the wafer.

The invention will be further described by way of example only, with reference to the accompanying drawings in which FIG. 1 illustrates diagrammatically, and to an enlarged scale, a wafer bearing a rectangular array of microelectronic chips. Only a sufficient number of chips has been shown to make clear the principle of the invention. FIG. 2 is an end view.

FIG. 3 illustrates diagrammatically a modification of the embodiment of FIG. 1.

Referring to FIG. 1 of the drawings, a wafer is indicated generally by numeral 10. On the wafer in a rectangular array of chips, n of them in the x direction and m of them in the y direction; individual chips being identifiable by symbols X1, Y1 to Xn Ym. Not all of the chips have been illustrated, since this is unnecessary for the purpose of explaining the invention. The chips are interconnectable through connections on the front surface of the wafer 10 in the manner set forth, for example, in the aforementioned UK patent specification No. 1377859. Additionally chips adjacent opposite edges of the water 10 are connected one to another. Output connections X1 Ym X of chip X1 Ym are connected through electrical conductors in the y-direction diagrammatically illustrated and indicated by numeral 12, to input connections X1 Y1 X of chip X1 Y1.

Similarly output connections of chips X2 Ym are connected to input connections of chip X2 Y1, and so forth to chips Xn Ym and Xn Y1. The additional connections through electrical conductors 12 allow the chips on the wafer to function effectively as though arranged on the surface of a cylinder; ie a surface which if traversed in a suitable direction is unbounded. It may sometimes be of advantage to arrange the electrical conductors 12 (See FIG. 3) so that output connections of chip X1 Ym are connected to input connections of (say) chip X2 Y1 and so forth; that is, the connections are staggered. In this way, the chips are arranged helically on the surface of a cylinder.

Still further connections may be made, but in the x-direction, through conductors diagrammatically illustrated, and indicated by numeral 14, bwtween output connections of chip X1 Y1 and input connections of chip Xn Y1, and so forth to chips X1 Ym and Xn Ym. These further connections, beyond those provided through electrical conductors 12, allow the chips on the wafer 10 to function effectively as though arranged on the surface of a toroid. If these further connections are also staggered, as described above, and illustrate at 14 in FIG. 3, then the chips may be regarded as being arranged on an endless helix on a toroidal surface.

The invention has been described with reference to a rectangular array of chips on a wafer, but it may extend to other kinds of array, for example a hexagonal array.

The electrical conductors could be arranged as individual, fine, insulated wires. However, in working the invention it will generally be more convenient to provide the conductors by printed circuit methods. By way of example, FIG. 2 shows an end view of the wafer of FIG. 1. The electrical conductors 14 are arranged as printed conductors on an insulating substrate 16. They in turn are overlaid by a second insulating substrate 18 on which the electrical conductors 12 are arranged, also as printed conductors. The whole wafer can be mounted and encapsulated in usual manner.

The provision of additional connections between chips, through conductors 12 and 14 for example, as described above in general allows the path length which can be built up, in terms of interconnected sound chips, to be increased in comparison with that which can be built up on a comparable wafer which is wholly bounded.

In known methods of circuit testing, for example as described in UK patent specification No. 1377859, the path of sound chips must usually be commenced from a specified chip at or near the mid point of the wafer. If this specified chip should be faulty the whole wafer must be discarded. There is the further disadvantage of the necessity of taking leads to the middle of the wafer. In the present invention due to the unbounded nature of the arrangement of chips on a wafer, access to the first chip can be arranged at the apparent edge of the wafer, and if the first chip to which connection is made, for the purpose of building up a path, proves to be faulty, then in general, connection can be transferred to a neighbouring chip which may prove to be sound. Thus the present invention provides the advantage that the number of wafers discarded may be reduced.

I claim:

1. In a circuit configuration for use in testing microelectronic circuit chips, said circuit configuration being of the type comprising a flat wafer having non-adjacent opposite physical edges and thereon within the region bounded by said physical edges oo, said wafer surface having thereon an array of microelectronic circuit chips to be tested, each of the chips on said wafer comprising a digital circuit which processes digital information and to transfer digital information and control signals from a set of input connections on the chip to one of a plurality of sets of output connections on the chip selected by a switching circuit within the digital circuit, each set of output connections being connected to input connections of an adjacent chip on said wafer in accordance with the operation of the switching circuit thereby to set up a chain of interconnected sound chips in said array or said surface on said wafer which extends from a selected sound first chip and which bypasses faulty chips on said wafer, the improvement wherein said circuit configuration includes electrical connections which directly connect an output connection of each chip immediately adjacent a first physical edge of the said flat wafer to the input connection of a different chip adjacent a second physical edge of the said flat wafer whereby all chips behave electrically as though the surface of said flat wafer were unbounded in a direction transverse to said first and second edges and whereby the said selected first chip in said chain of interconnected chips is located immediately adjacent one of the physical edges of said flat wafer.

2. The circuit configuration of claim 1 wherein said wafer has a rectangular configuration and said electrical connections extend between two opposite edges of said wafer whereby the chips behave electrically as though they are on the surface of a cylinder.

3. The circuit configuration of claim 1 wherein said electrical connections extend between opposite edges of said wafer and are staggered relative to the chips adjacent said opposite edges respectively whereby the chips behave electrically as though they are on a helix.

4. The circuit configuration of claim 1 in which said electrical connections include first connections extending between chips that are located adjacent a first pair of opposite edges of said wafer respectively, and second connections extending between chips that are located adjacent a second different pair of edges of said wafer respectively, whereby the chips behave electrically as though they are on the surface of a toroid.

5. The circuit configuration of claim 1 in which said electrical connections include first connections extending between chips that are located adjacent a first pair of opposite edges of said wafer respectively and which are staggered relative to the chips adjacent said first pair of opposite edges, and second connections extending between chips that are located adjacent a second different pair of edges of said wafer respectively and which are staggered relative to the chips adjacent said second pair of edges, whereby the chips behave electrically as though they are on an endless helix.

6. The circuit configuration of any one of claims 2, 3, 4 or 5 wherein said electrical connections include conductors that are disposed adjacent a surface of said wafer opposite to the wafer surface carrying said chips.

* * * * *

UNITED STATES PATENT AND TRADEMARK OFFICE
CERTIFICATE OF CORRECTION

PATENT NO. : 4,295,182

DATED : October 13, 1981

INVENTOR(S) : Russell C. Aubusson and Richard J. Gledhill

It is certified that error appears in the above—identified patent and that said Letters Patent is hereby corrected as shown below:

Column 1 line 36 after "3,913,072" insert -- ) --

Column 2 line 21 change "in" to -- is -- line 30 change "water" to -- wafer -- line 51 change "bwtween" to -- between --

Column 3 line 34 after "and" insert -- a surface -- line 35 delete "oo"

line 39 change "to transfer" to -- transfers -- line 46 change "in" to -- on -- line 47 delete "array or said surface on said"

Column 4 line 6 after "chip" insert -- immediately --

UNITED STATES PATENT AND TRADEMARK OFFICE
CERTIFICATE OF CORRECTION

PATENT NO. : 4,295,182

DATED : October 13, 1981

INVENTOR(S) : Russell C. Aubusson et al.

It is certified that error appears in the above—identified patent and that said Letters Patent is hereby corrected as shown below:

Column 4, line 8 after "chips" insert -- in said array on said surface --.

Signed and Sealed this

Sixteenth Day of March 1982

[SEAL]

Attest:

GERALD J. MOSSINGHOFF

Attesting Officer — Commissioner of Patents and Trademarks